(12) United States Patent
Tomomatsu et al.

(10) Patent No.: US 6,336,402 B1
(45) Date of Patent: Jan. 8, 2002

(54) SCREEN PRINTING METHOD AND APPARATUS HAVING AN AIR BLOWER

(75) Inventors: Michinori Tomomatsu, Koga; Seiichi Miyahara, Kurume; Minoru Murakami, Chikushino; Seikoh Abe, Kurume, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/487,251

(22) Filed: Jan. 19, 2000

(30) Foreign Application Priority Data

Jan. 21, 1999 (JP) .............................. 11-012812

(51) Int. Cl.[7] .............................. B41M 1/12; B41F 15/44
(52) U.S. Cl. ................ 101/129; 101/123; 101/114; 101/126
(58) Field of Search ................. 101/114, 123, 101/126, 129, 127, 127.1, 424.1, 487, 488; 118/213, 406; 427/96, 348, 398.1, 398.4

(56) References Cited

U.S. PATENT DOCUMENTS

| 5,452,655 A | * | 9/1995 | Tani ........................... 101/123 |
| 5,802,970 A | * | 9/1998 | Tani ........................... 101/123 |
| 5,876,498 A | * | 3/1999 | Thompson, Sr. ......... 101/127.1 |
| 5,996,487 A | * | 12/1999 | Tomomatsu et al. ........ 101/123 |
| 6,135,024 A | * | 10/2000 | Higashida et al. .......... 101/123 |

* cited by examiner

Primary Examiner—Leslie J. Grohusky
(74) Attorney, Agent, or Firm—Wenderoth, Lind & Ponack, L.L.P.

(57) ABSTRACT

A screen printing apparatus is designed so that cream solder 17 disposed on a mask plate 12 can be preserved at a certain appropriate temperature by the limited use of blown air. An air nozzle unit 20 is provided above the mask plate 12 at a place on the side edge running in parallel with the moving direction of a squeegee 16. The temperature-conditioning air is blown sidewise from the air nozzle unit 20 towards the cream solder 17 during the operation of printing the cream solder 17 on the surface of a substrate through the mask plate 12 disposed in contact therewith.

15 Claims, 2 Drawing Sheets

SCREEN PRINTING METHOD AND APPARATUS HAVING AN AIR BLOWER

FIELD OF THE INVENTION

The present invention relates to a screen printing apparatus for printing cream solder, conductive paste or the like paste on a substrate, and a screen printing method.

BACKGROUND OF THE INVENTION

Screen-printing is a popular process for printing cream solder, conductive paste or the like paste on the surface of a substrate used when mounting electronic components on the substrate. A screen mask provided with pattern holes in areas corresponding to the target region of printing is placed on a substrate making contact with the surface, a paste is supplied on the screen mask to be squeezed by a moving squeegee, and the paste infiltrating through the pattern holes is printed on the substrate.

In order to provide a superior printing quality, viscosity of the paste needs to be maintained at an appropriate level during the printing operation. For this purpose, a temperature control mechanism is provided in the screen printing apparatus for keeping the temperature of the paste dispensed on a mask plate within a certain range. A temperature control mechanism employed in conventional screen printing apparatus is configured to have an air blowing mouth above a squeegee which moves sliding on a mask plate; the temperature-conditioning air is blown from the mouth towards the surface of the mask plate.

However, in the above described temperature control mechanism, smooth flow of the temperature-conditioning air delivered from the air blowing mouth is disturbed every time when a squeegee holding head, which is locating in between the air blowing mouth and the mask plate, moves for squeezing the paste. This hinders the temperature control mechanism from performing at full function and the operational efficiency is deteriorated. If a massive airflow is provided on the mask plate in order to raise the temperature control function to a satisfactory level, the paste is deprived too much of volatile matters contained therein and the paste becomes dried.

The present invention addresses the above described drawbacks and aims to offer a screen printing apparatus, as well as a screen printing method, in which the temperature of paste can be controlled efficiently using a limited quantity of blowing air, and superior printing quality is assured.

SUMMARY OF THE INVENTION

A screen printing apparatus of the present invention comprises a substrate holding section for holding a substrate, a squeegee which slides on a mask plate having a pattern hole for printing a paste dispensed on the mask plate and filtrated through the pattern hole on the substrate, and an air blower for blowing the temperature-conditioning air sidewise towards paste disposed on the mask plate. In the above described configuration, since temperature-conditioned air is blown toward the paste from the side, the air flow is not disturbed by a squeegee unit; so, a small amount of air can efficiently control the temperature of the paste.

It is preferred to provide the air blower with an air blowing slit for forming an air curtain, in order to curtail the thermal convection outwardly from a the space containing an object of the temperature control to the outside environment. The air curtain contributes to further reduce the volume of the temperature-conditioning air needed to keep the paste on the mask plate at a specified temperature level.

A screen printing method of the present invention comprises the steps of placing a mask plate having a pattern hole on a substrate to make contact on the surface, dispensing paste on the mask plate, moving a squeegee to slide on the mask plate so that the paste filtrating though the pattern hole is printed on the substrate, and blowing the temperature-conditioning air sidewise towards the paste for keeping the paste disposed on the mask plate at a specified temperature level.

It is preferred in the above printing method to form an air curtain for curtailing the air convection outwardly from a space containing an object of temperature control to the outside environment.

DESCRIPTION OF THE PREFERRED EMBODIMENTS

An exemplary embodiment of the present invention is described in the following with reference to FIG. 1 and FIG. 2.

Figure 1:
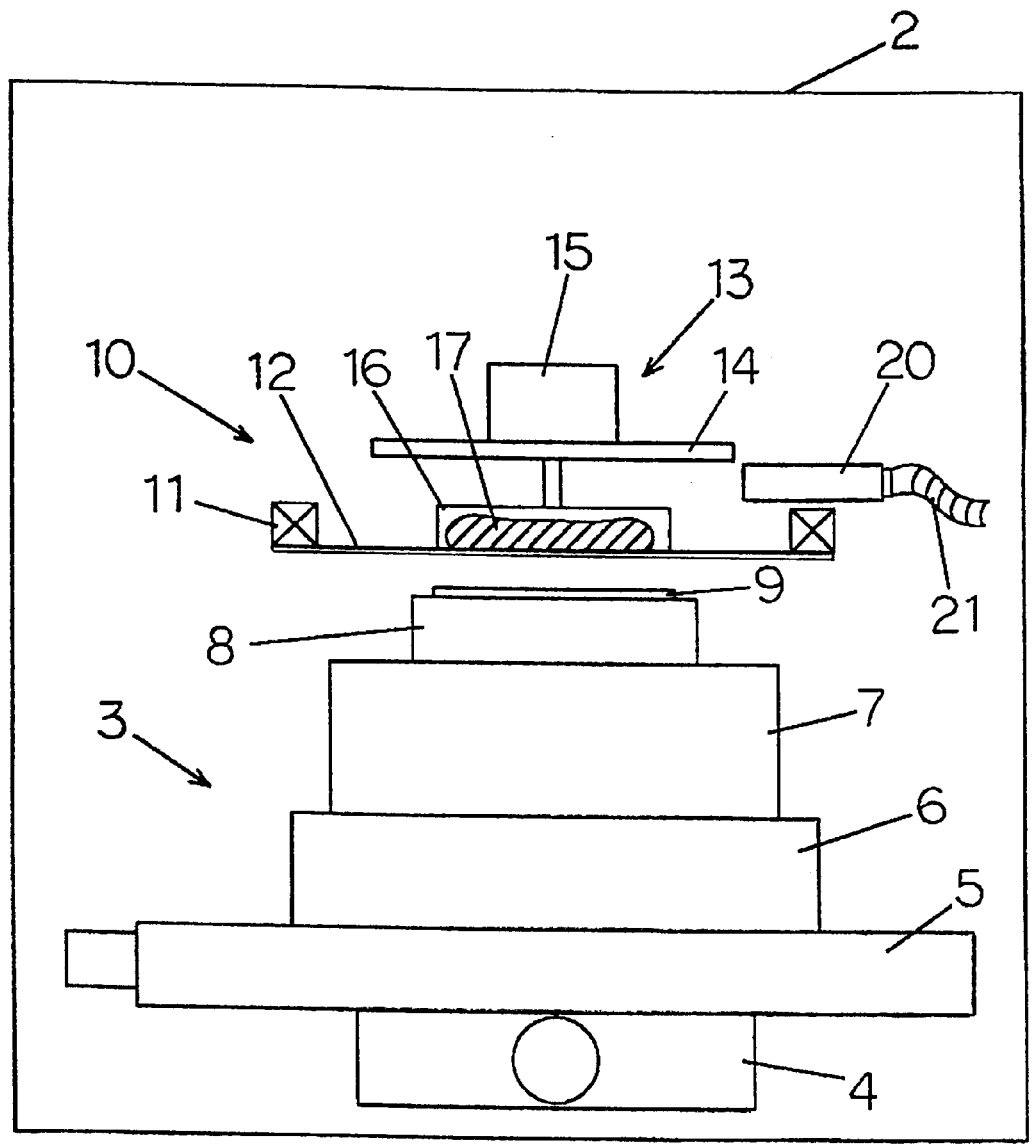
FIG. 1 is a sectional view of a screen printing apparatus in an exemplary embodiment of the present invention.

As shown in FIG. 1, there are two main functional sections in the screen printing apparatus; namely, a substrate location setting section 3 and a screen printing section 10 are housed within a cover 2. The substrate location setting section 3 has a stacked structure of an X-axis table 4, a Y-axis table 5 and a θ-axis table 6, and a Z-axis table 7 is placed thereon. Provided on the Z-axis table 7 is a substrate holder 8 for holding a substrate 9.

The screen printing section 10 is disposed above the substrate location setting section 3. In the screen-printing section 10, a mask plate 12 stretched by a holder frame 11 is provided, and a squeegee unit 13 is provided above the mask plate 12. The squeegee unit 13 is moved by transfer means (not shown) in a direction perpendicular to the plane of the drawing. A plate 14 of the squeegee unit 13 is equipped with a squeegee elevation gear 15 for moving the squeegee 16 up and down.

A cream solder 17, or paste, is dispensed on the mask plate 12. By moving the squeegee 16 in a direction perpendicular to the drawing sheet while the bottom surface of the mask plate 12 is kept in contact with the substrate 9, the cream solder 17 is printed on the substrate 9 through pattern holes (not shown) of the mask plate 12.

An air nozzle unit 20, or air blowing means, is provided above the mask plate 12 in a place on the side edge that is in parallel with the squeegee 16's moving direction. The air nozzle unit 20 is provided with a rectangular spout in a side spreading in parallel with the squeegee 16's moving direction, with the direction of length of the spout in parallel with the moving direction of squeegee 16. The air nozzle unit 20 is coupled with an air unit 24 (see FIG. 2) that generates the temperature-conditioning air and supplies it via an air duct 21. The temperature-conditioned air delivered to the air nozzle unit 20 is blown through the spout towards the cream solder 17 disposed on the mask plate 12, from a sidewise direction other than the moving direction of squeegee 16.

Figure 2:
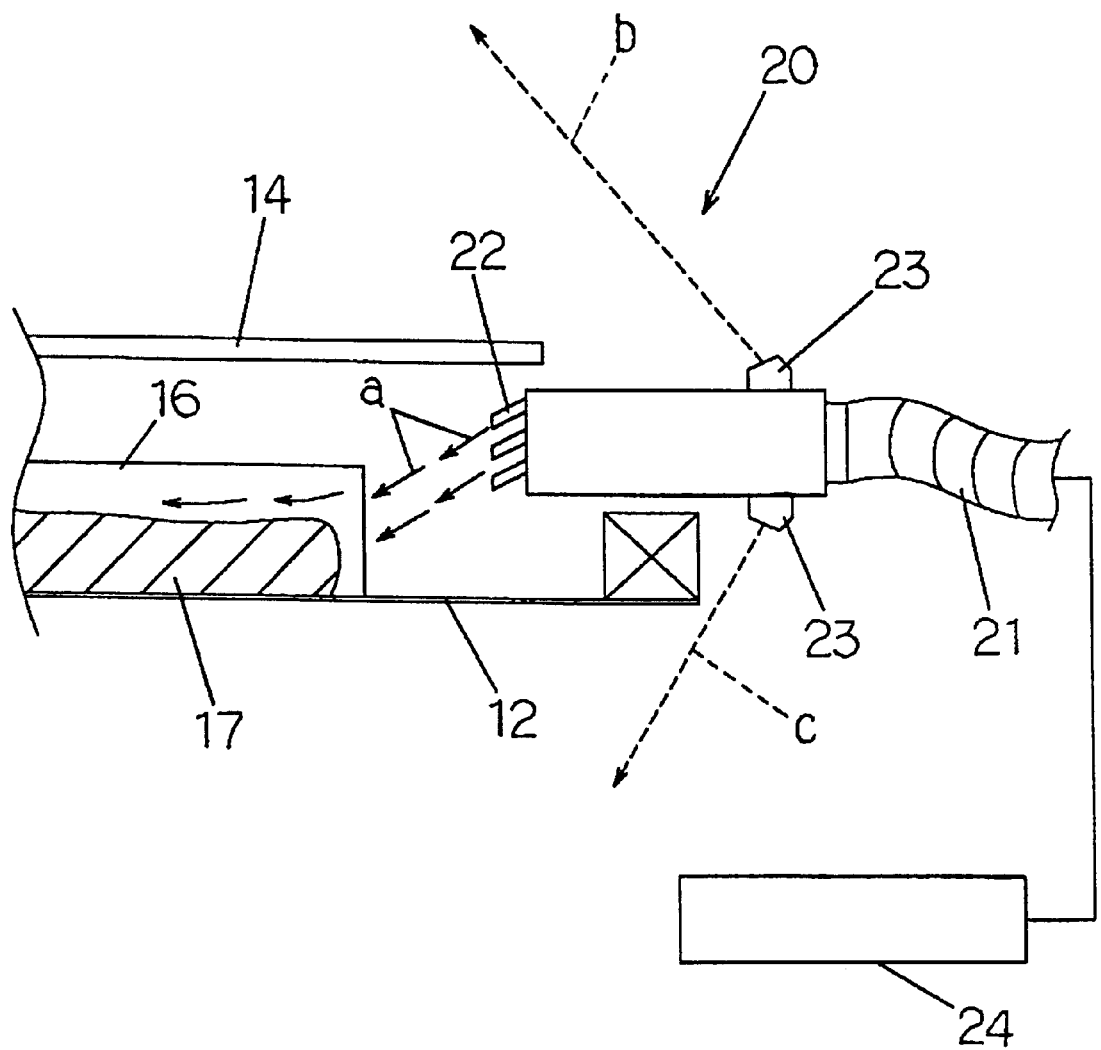
FIG. 2 is a partly sectioned view of the screen printing apparatus of FIG. 1, used to describe the temperature-conditioning function.

The structure and function of the air nozzle unit 20 are further described referring to FIG. 2. The spout of air nozzle unit 20, which is located in proximity to the cream solder 17, is provided with a louver 22. The temperature-conditioned air is blown along a direction regulated by the louver 22 (direction of an arrow mark "a" in FIG. 2) into a space surrounded by the plate 14 of squeegee unit 13 and the mask plate 12. The cream solder 17 surrounded by the temperature-conditioned air is adjusted to and kept in a certain predetermined temperature level.

With the above described structure, where the louver 22 is disposed in proximity to an object of the temperature control, or cream solder 17, disturbance by a squeegee holding head on the smooth air flow, which was observed in the conventional configuration, is not caused; consequently, the temperature control is performed efficiently without incurring heat loss. This leads to a saving in the volume of air blown from the louver 22, and as a result, the trouble of dried cream solder 17 caused by exposure to too much blown air is prevented. The cream solder 17 is thus preserved at an appropriate temperature level and viscosity for performing a superior screen printing operation.

The air nozzle unit 20 is provided with an air knife 23 on the upper surface and the bottom surface, the air knife having an air blowing slit extending along a direction in parallel with the moving direction of squeegee 16. A thin laminate air flow comes out of the air knife 23 towards the screen printing section 10 at an oblique upward angle (indicated with an arrow mark "b" in FIG. 2) and at an oblique downward angle (an arrow mark "c"), forming a so-called air curtain. The air curtain isolates a space around the mask plate 12, or the space containing the object of the temperature control, on which the cream solder 17 is disposed, from the outside environment by cutting motion of the air in both upward and downward directions. Thus the heat convection between the space containing the object of the temperature control and the outside ambient is curtailed. Therefore, the volume of temperature-conditioning air required to keep the cream solder 17 in an appropriate temperature range can be further reduced; which contributes to lowering the facility cost, as well as the running cost, of a screen printing apparatus.

What is claimed is:

1. A screen printing apparatus for use in printing paste onto a substrate, said screen printing apparatus comprising:
   a substrate holding section for holding the substrate;
   a mask plate having a pattern hole and adapted to receive paste;
   a squeegee arranged for sliding movement on said mask plate so that paste received on said mask plate is adapted to be printed on the substrate through the pattern hole; and
   an air blower for blowing temperature-conditioning air from a side direction towards the paste received on the mask plate;
   wherein said air blower is further provided with a slit for forming an air curtain that curtails heat convection outwardly from a space adapted to contain the paste when the paste is received on said mask plate.

2. The screen printing apparatus of claim 1, wherein said air blower is arranged so as to be disposed above the mask plate at a location on a side of said mask plate.

3. A screen printing method comprising the steps of:
   placing a mask plate having a pattern hole adjacent a substrate;
   dispensing paste onto said mask plate;
   sliding a squeegee in a sliding direction on said mask plate so that said paste is printed on said substrate through said pattern hole;
   blowing temperature-conditioning air sidewise towards said paste so that the paste disposed on said mask plate is preserved in a predetermined temperature range; and
   forming an air curtain for curtailing air convection outwardly from a space containing the paste.

4. The screen printing method recited in claim 3, wherein said blowing step comprises blowing temperature-conditioning air sidewise in a direction other than the sliding direction of said squeegee.

5. The screen printing method recited in claim 4, wherein said step of forming the air curtain comprises blowing air towards the space containing the paste in upward and downward directions.

6. The screen printing method recited in claim 3, wherein said blowing step comprises generating said temperature-conditioning air at an air generating source for generating temperature-conditioning air and delivering said temperature-conditioning air by way of an air duct to an air blower to be blown outside therefrom.

7. The screen printing method recited in claim 3, wherein said step of forming the air curtain comprises blowing air towards the space containing the paste in upward and downward directions.

8. The screen printing method recited in claim 3, wherein
   in said blowing of said temperature-conditioning air, said temperature-conditioning air is blown in a direction generally perpendicular to said sliding direction.

9. The screen printing method recited in claim 3, wherein
   said squeegee is elongated in a longitudinal direction; and
   in said sliding of said squeegee, said squeegee is slid in a direction generally perpendicular to said longitudinal direction of said squeegee.

10. A screen printing apparatus for use in printing paste onto a substrate, said screen printing apparatus comprising:
    a substrate holding section for holding the substrate;
    a mask plate having a pattern hole and adapted to receive paste;
    a squeegee elongated in a longitudinal direction and arranged for sliding movement on said mask plate in a sliding direction generally perpendicular to said longitudinal direction so that the paste received said mask plate is adapted to be printed on the substrate through the pattern hole; and
    an air blower for blowing temperature-conditioning air, substantially along said longitudinal direction in which said squeegee is elongated, towards the paste received on said mask plate.

11. The screen printing apparatus of claim 10, wherein said air blower is arranged so as to be disposed above said mask plate at a location on a side of said mask plate.

12. The screen printing apparatus of claim 10, wherein said air blower is further provided with a slit for forming an air curtain that curtails heat convection outwardly from a space adapted to contain the paste when the paste is received on said mask plate.

13. A screen printing method comprising the steps of:
    placing a mask plate having a pattern hole adjacent a substrate;
    dispensing paste onto said mask plate;
    sliding a squeegee in a sliding direction on said mask plate so that said paste is printed on said substrate through said pattern hole;

blowing temperature-conditioning air sidewise towards said paste so that the paste disposed on said mask plate is preserved in a predetermined temperature range; and wherein said blowing step comprises blowing temperature-conditioning air sidewise in a direction generally perpendicular to the sliding direction of said squeegee.

14. The screen printing method recited in claim 13, wherein said blowing step comprises generating said temperature-conditioning air at an air generating source for generating temperature-conditioning air and delivering said temperature-conditioning air by way of an air duct to an air blower to be blown outside therefrom.

15. The screen printing method recited in claim 13, wherein said squeegee is elongated in a longitudinal direction; and in said sliding of said squeegee, said squeegee is slid in a direction generally perpendicular to said longitudinal direction of said squeegee.

* * * * *